United States Patent
Yoshihara et al.

(10) Patent No.: US 6,939,622 B2
(45) Date of Patent: Sep. 6, 2005

(54) CHIP-ON-FILM USE COPPER FOIL

(75) Inventors: Yasuhisa Yoshihara, Tochigi (JP); Hisao Kimijima, Tochigi (JP)

(73) Assignee: Furukawa Circuit Foil Co., LTD, Tokyo (JP)

( * ) Notice: Subject to any disclaimer, the term of this patent is extended or adjusted under 35 U.S.C. 154(b) by 0 days.

(21) Appl. No.: 10/777,039

(22) Filed: Feb. 13, 2004

(65) Prior Publication Data

US 2004/0161627 A1 Aug. 19, 2004

(30) Foreign Application Priority Data

Feb. 17, 2003 (JP) .......................... 2003-038290

(51) Int. Cl.$^7$ .......................... B32K 26/00; B32K 26/38
(52) U.S. Cl. .................. 428/675; 428/548; 428/607; 428/612; 428/615; 428/668
(58) Field of Search .................. 428/435, 548, 428/607, 612, 615, 668, 675, 687, 596, 637

(56) References Cited

U.S. PATENT DOCUMENTS 5,366,814 A * 11/1994 Yamanishi et al. ......... 428/607
6,638,642 B2 * 10/2003 Kitano et al. ............... 428/607

FOREIGN PATENT DOCUMENTS

| EP | 0 396 056 | 11/1990 |
|----|-----------|---------|
| JP | 2-292894  | 12/1990 |
| JP | 8-335775  | 12/1996 |
| JP | 8-335776  | 12/1996 |
| JP | 9-87888   | 3/1997  |
| JP | 9-87889   | 3/1997  |

OTHER PUBLICATIONS

European Search Report dated May 21, 2004.
Patent Abstracts of Japan, vol. 015, No. 070 (E–1035), Feb. 19, 1991 & JP 02 292894 A (Nikko Guurudo Fuoiru KK), Dec. 4, 1990 *abstract*.
Patent Abstracts of Japan, vol. 1997, No. 04, Apr. 30, 1997 & JP 08 335775 A (Nikko Gould Foil KK), Dec. 17, 1996 *abstract*.
Patent Abstracts of Japan, vol. 1997, No. 04, Apr. 30, 1997 & JP 08 335776 A (Nikko Gould Foil KK), Dec. 17, 1996 *abstract*.
Patent Abstracts of Japan, vol. 1997, No. 07, Jul. 31, 1997 & JP 09 087888 A (Nikko Gould Foil KK), Mar. 31, 1997 *abstract*.
Patent Abstracts of Japan, vol. 1997, No. 07, Jul. 31, 1997 & JP 09 087889 A (Nikko Gould Foil KK), Mar. 31, 1997 *abstract*.

* cited by examiner

Primary Examiner—Cathy F. Lam
(74) Attorney, Agent, or Firm—Armstrong, Kratz, Quintos, Hanson & Brooks, LLP

(57) ABSTRACT

A copper foil having a high etching factor, enabling formation of fine patterns excellent in linearity of bottom lines of circuit patterns and without leaving particles of copper foil forming the circuit patterns in the resin, free from a drop in bond strength between the copper foil and resin substrate due to the processing for formation of solder balls, excellent in visibility, and excellent in mounting of ICs on fine patterns, comprising a copper foil on at least one surface of which is provided an alloy fine roughening particle layer comprised of a copper-cobalt-nickel alloy with contents of cobalt and nickel equal to or greater than that of copper, specifically a copper foil on the surface of the copper foil for bonding with the resin substrate of which is provided an alloy fine roughening particle layer comprised of 5 to 12 mg/dm$^2$ copper, 6 to 13 mg/dm$^2$ cobalt, and 5 to 12 mg/dm$^2$ nickel, wherein the alloy fine roughening particle layer provided on the copper foil surface may be treated for stainproof or may be treated by a silane coupling agent.

4 Claims, No Drawings

CHIP-ON-FILM USE COPPER FOIL

BACKGROUND OF THE INVENTION

1. Field of the Invention

The present invention relates to copper foil optimal for chip-on-film (COF) mounting in fine pattern printed circuit boards.

2. Description of the Related Art

Along with the smaller size and lighter weight of electronic equipment, recent electronic devices have been integrated to advanced levels. Corresponding with this, the circuit patterns in the printed circuit boards have also been required to be made higher in density. Circuit patterns of fine line widths and interconnect pitches are now being formed. Particular advances are being made in increasing density in IC mounting boards for driving liquid crystal displays of PCs, mobile phones, and PDAs. The ICs are directly mounted on the board film, so this is called "chip-on-film" (COF) mounting.

With COF mounting, light passing through the film formed with the copper foil interconnect patterns is used to detect the IC positions. However, the visibility of conventional electrodeposited copper foil used for printed circuit boards (ability of detection of IC positions by light) is extremely poor. The reason for this is the high surface roughness of the copper foil. The parts of the film passing the light are parts where unnecessary copper foil other than the copper circuit parts has been etched away. The relief patterns of the surface of the copper foil are transferred to the film surface when bonding the copper foil to the film and remain there. When the light pass through the film, the amount of light which can proceed straight becomes smaller due to the relief patterns on the film surface and consequently the visibility becomes poorer.

Since the visibility is poor in conventional electrodeposited copper foil for printed circuit boards, two-layer materials comprised of polyimide film on which a copper layer is formed by sputtering (thin film formation process) and then copper is plated are used.

However, the bond strength of this sputtered copper layer with the film is weak and the etching solution or plating solution will erode between the copper foil and film at the time of forming the circuit resulting in the so-called "undercut" phenomenon. Further, since the bond strength is weak, the danger is harbored of the copper layer peeling off during use of the product.

On the other hand, as a method of treatment of copper foil for a circuit board, the method of roughening the surface of the copper foil by plating it by a copper-cobalt-nickel alloy comprised of copper and small amounts of cobalt and nickel has been proposed (for example, see Japanese Unexamined Patent Publication (Kokai) No. 2-292894). The copper foil obtained by this roughening treatment is excellent in etchability, alkali etchability, and resistance to hydrochloric acid, but several defects have been pointed out such as the heat resistant peeling strength dropping when using an acrylic-based adhesive, the oxidation resistance also being not sufficient, and the color not becoming black, but brown to charcoal brown (for example, see Japanese Unexamined Patent Publication (Kokai) No. 9-87889). Practical application has therefore not yet been achieved.

Therefore, research has been conducted on improving the copper foil. Methods of forming three-layer structures calling for plating the surface of a copper foil with an alloy of copper, an amount of cobalt about $\frac{1}{10}$ that of the copper, and an amount of nickel about $\frac{1}{40}$ that of the copper, then forming a cobalt-nickel alloy plating layer over that, then forming a zinc plating layer (for example, see Japanese Unexamined Patent Publication (Kokai) No. 9-87888) or forming a zinc-nickel plating layer (for example, see Japanese Unexamined Patent Publication (Kokai) No. 9-87889) or methods of forming three-layer structures calling for roughening the surface of a copper foil by plating by an alloy of copper, an amount of cobalt about $\frac{1}{10}$ that of the copper, and an amount of nickel about $\frac{1}{40}$ that of the copper, then forming a cobalt plating layer, then further forming a zinc plating layer (for example, see Japanese Unexamined Patent Publication (Kokai) No. 8-335775) or forming a zinc-nickel plating layer (for example, see Japanese Unexamined Patent Publication (Kokai) No. 8-335776) have been disclosed. These methods have in particular been proposed as methods for treatment of copper foil reducing the drop in bond strength between a copper foil and a resin substrate occurring due to the much higher temperature of treatment performed in the process of production of circuit boards along with the smaller size and greater integration of semiconductor devices and the heat generated during use of apparatuses and thereby further improving the resistance to peeling under heat.

However, if employing the above three-layer structure improved copper foil for COF mounting, the following problem arises.

That is, the above copper foil is used to produce a circuit board satisfying the requirements for finer patterns and the ICs are mounted on the circuit board, but mounting the ICs on the circuit board requires that solder balls be placed on the copper foil circuits on the circuit board. To enable solder balls to be placed on the copper foil, the bondability with solder is raised by plating the copper foil with tin. The tin plating solution in this tin plating process dissolves the particles provided on the copper foil surface and ends up remarkably detracting from the peeling strength between the copper foil and circuit board.

SUMMARY OF THE INVENTION

An object of the present invention is to provide a copper foil having a high etching factor, enabling formation of fine patterns excellent in linearity of bottom lines of circuit patterns and without leaving particles of copper foil forming the circuit patterns in the resin, free from a drop in bond strength between the copper foil and resin substrate during the processing for formation of solder balls, excellent in visibility, and excellent in mounting of ICs on fine patterns.

To attain the above object, there is provided a copper foil comprising a copper foil on at least one surface of which is provided an alloy fine roughening particle layer comprised of a copper-cobalt-nickel alloy with contents of cobalt and nickel equal to or greater than that of copper.

The alloy fine roughening particle layer provided on the copper foil surface may be treated for stainproof.

Further, the alloy fine roughening particle layer provided on the copper foil surface may be treated by a silane coupling agent.

By treating the surface of the alloy fine roughening particle layer provided on the copper foil surface for stainproof and/or by a silane coupling agent, it is possible to prevent oxidation and discoloration of the copper foil.

DESCRIPTION OF THE PREFERRED EMBODIMENTS

Preferred embodiments of chip-on-film (COF) film copper foil (hereinafter referred to as "COF foil") according to the present invention will be described in detail below.

The COF foil of the present embodiment is comprised of a copper foil on at least one surface of which is provided an alloy fine roughening particle layer of an alloy composition of a copper-cobalt-nickel alloy with contents of cobalt and nickel equal to or greater than the copper.

The plating alloy composition of the alloy fine roughening particle layer of the present embodiment overturns the concept of the conventional plating alloy composition of small amounts of addition of both cobalt and nickel with respect to the copper and consequent inability to be always satisfactory as a COF foil. The inventors conducted various experiments without imposing any limits on the amounts of the cobalt and nickel with respect to the copper. As a result, they noticed that by increasing the amounts of addition of both cobalt and nickel from the amounts conventionally conceivable with respect to the copper, they could obtain copper foil satisfactory as COF foil. The inventors engaged in further experiments and research and based on the findings succeeded in obtaining copper foil having a high etching factor, enabling formation of fine patterns excellent in linearity of bottom lines of circuit patterns and without leaving particles of copper foil forming the circuit patterns in the resin, and excellent in visibility by providing at least the surface of copper foil to be bonded with a resin substrate with an alloy fine roughening particle layer comprised of a copper-cobalt-nickel alloy with contents of cobalt and nickel equal to or greater than that of copper, specifically, at that time, making the composition of the alloy fine roughening particle layer deposited per $dm^2$ of the copper foil 5 to 12 $mg/dm^2$ copper, 6 to 13 $mg/dm^2$ cobalt, and 5 to 12 $mg/dm^2$ nickel.

Further, the copper foil on the surface of which fine roughening particles were deposited is bonded on a polyimide resin substrate, and is etched to form circuits, and the resultant COF (substrate) is placed over ICs while enabling the ICs to be seen, and the copper foil is plated with tin in the process of connecting the copper foil circuits and ICs. In this tin plating process, if the temperature of the tin plating solution is extremely high, the plating solution will erode between the copper foil and resin substrate, that is, the undercut phenomenon will occur. For such applications, the fine roughening particle alloy composition has to be made one where undercut does not occur.

The inventors studied this point as well and studied alloy compositions in fine roughening particles where the undercut phenomenon does not occur and as a result discovered that by making the amount of cobalt 1.2 to 2.2 $mg/dm^2$ per $mg/dm^2$ of presence of copper and the amount of nickel 1.0 to 2.0 $mg/dm^2$, the undercut phenomenon can be suppressed and that by making the amount of cobalt 1.5 to 1.9 $mg/dm^2$ per $mg/dm^2$ of presence of copper and the amount of nickel 1.3 to 1.7 $mg/dm^2$, the undercut phenomenon can be reliably prevented and therefore no drop in bond strength between the copper foil and resin substrate will be caused due to the processing for formation of solder balls.

More specifically, the amount of deposition of the alloy fine roughening particle layer on the copper foil surface should be made the range of 5 to 12 $mg/dm^2$ copper, 6 to 13 $mg/dm^2$ cobalt, and 5 to 12 $mg/dm^2$ nickel. The reason for setting this range is mainly the results of the following experiment.

1. Amount of deposition of copper

Under 5 $mg/dm^2$, the solubility in the etching solution becomes poor and etching residue is formed, while over 12 $mg/dm^2$, the heat resistance becomes poor.

2. Amount of deposition of cobalt

Under 6 $mg/dm^2$, the solubility in the etching solution becomes poor and etching residue is formed, while over 13 $mg/dm^2$, the undercut phenomenon cannot be reliably prevented.

3. Amount of deposition of nickel

Under 5 $mg/dm^2$, the undercut phenomenon cannot be reliably prevented, while over 12 $mg/dm^2$, the solubility in the etching solution becomes poor and etching residue is formed.

EXAMPLES 1 to 3

As the copper foil, electrodeposited copper foil (B-WS foil, made by Furukawa Circuit Foil) was used. This was formed on its surface with an alloy fine roughening particle layer by plating by a copper-cobalt-nickel alloy. The plating solution composition and plating conditions were as follows:

| | |
|---|---|
| Cu: | 2 g/liter |
| Co: | 8 g/liter |
| Ni: | 8 g/liter |
| Ammonium sulfate: | 40 g/liter |
| Boric acid: | 20 g/liter |
| pH: | 3.5 |
| Temperature: | 40° C. |
| Current density: | 15 $A/dm^2$ |

The inventors changed the plating times under the above conditions to obtain different alloy compositions on the surfaces of the COF copper foil. The results are shown in Table 1. In Table 1, the contents of the copper, cobalt, and nickel are shown in units of $mg/dm^2$. The ratios with respect to the copper as 1 are shown in parentheses.

TABLE 1

| Example | Content of copper | Content of cobalt | Content of nickel |
|---|---|---|---|
| 1 | 7.8 (1) | 12.95 (1.66) | 11.35 (1.45) |
| 2 | 6.6 (1) | 11.02 (1.67) | 9.44 (1.43) |
| 3 | 6.6 (1) | 10.95 (1.66) | 9.69 (1.47) |

EXAMPLE 4

As the copper foil, rolled copper foil (made by Nippon Foil Manufacturing Co., Ltd.) was used. This was formed on its surface with an alloy fine roughening particle layer by plating by a copper-cobalt-nickel alloy. The plating solution composition and plating conditions were as follows:

| | |
|---|---|
| Cu: | 2 g/liter |
| Co: | 8 g/liter |
| Ni: | 8 g/liter |
| Ammonium sulfate: | 40 g/liter |
| Boric acid: | 20 g/liter |
| pH: | 3.5 |
| Temperature: | 40° C. |
| Current density: | 15 $A/dm^2$ |

The alloy composition on the surface of the COF copper foil prepared under the above conditions is shown in Table 2. The inventors were able to obtain copper foil having a smooth surface of Rz: 0.50 and Ra: 0.06. In Table 2, the contents of the copper, cobalt, and nickel are shown in units of $mg/dm^2$. The ratios with respect to the copper as 1 are shown in parentheses.

TABLE 2

| Example | Content of copper | Content of cobalt | Content of nickel |
| --- | --- | --- | --- |
| 4 | 6.5 (1) | 9.5 (1.46) | 7.5 (1.15) |

The inventors bonded polyimide film made by a film maker A at a high temperature and high pressure on the surface of the copper foil treated for deposition of fine roughening particles in Examples 1 to 4, whereupon they found the bondability to be excellent. Next, they bonded a dry film etching resist to the surface of the copper foil and performed etching to prepare a resin substrate for COF. When producing this resin substrate for COF, the circuits did not become wavy, the linearity of the circuits was extremely good, and a resin substrate for COF superior as a fine pattern was completed. This resin substrate could be positioned on a substrate with IC arranged on it while viewing the ICs, the position of the ICs could be easily confirmed from above the film, and the ICs and circuits of resin substrate could be accurately connected.

Next, the inventors bonded polyimide film made by a film maker B at a high temperature and high pressure on the surface of the copper foil treated for deposition of fine roughening particles in Examples 1 to 4, whereupon they found the bondability to be excellent. Next, they bonded a dry film etching resist to the surface of the copper foil and performed etching to prepare a resin substrate for COF. When producing this resin substrate for COF, the circuits did not become wavy, the linearity of the circuits was extremely good, and a resin substrate for COF superior as a fine pattern was completed. This resin substrate could be positioned on a substrate with IC arranged on it while viewing the ICs, the position of the ICs could be easily confirmed from above the film, and the ICs and circuits of resin substrate could be accurately connected.

The polyimide resin for bonding with the copper foil differs somewhat in color or bond strength with the copper foil or other performance depending on the supplying manufacturer, but the copper foils of Examples 1 to 4 were found to be satisfactory when bonded with polyimide films of all manufacturers, etched to prepare circuits, then measured for visibility for confirmation of IC position, bonding strength, etc.

Further, when applying chromate rust prevention treatment and silane coupling agent treatment to the surface of the alloy fine particle layer surface of the copper foils obtained in Examples 1 and 2 and measuring the visibility and bonding strength etc., it was confirmed that the properties were satisfactory.

Summarizing the effects of the invention, the present invention, as explained above, has the effects of giving copper foil having a high etching factor, enabling formation of fine patterns excellent in linearity of bottom lines of circuit patterns and without leaving particles of copper foil forming the circuit patterns in the resin, free from a drop in bond strength between the copper foil and resin substrate due to the processing for formation of solder balls, excellent in visibility, and excellent in mounting of ICs on fine patterns, While the invention has been described with reference to specific embodiments chosen for purpose of illustration, it should be apparent that numerous modifications could be made thereto by those skilled in the art without departing from the basic concept and scope of the invention.

What is claimed is:

1. A chip-on-film use copper foil comprising a copper foil on at least one surface of which is provided an alloy fine roughening particle layer comprised of copper-cobalt-nickel alloy particles with contents of cobalt and nickel equal to or greater than that of copper, wherein the amount ratio of copper-cobalt-nickel is 1:1.2 to 2.2:1.0 to 2.0.

2. A chip-on-film use copper foil as set forth in claim 1, wherein said alloy fine roughening particle layer provided on said copper foil surface is treated for stainproof.

3. A chip-on-film use copper foil as set forth in claim 1, wherein said alloy fine roughening particle layer provided on said copper foil surface is treated by a silane coupling agent.

4. A chip-on-film use copper foil comprising a copper foil on at least one surface of which is provided an alloy fine roughening particle layer comprised of copper-cobalt-nickel alloy particles with contents of cobalt and nickel equal to or greater than that of copper, wherein the amount ratio of copper-cobalt-nickel is 1:1.2 to 2.2:1.0 to 2.0, wherein the alloy fine roughening particle layer of the copper foil is bonded to a substrate.

* * * * *